United States Patent
Koike

(10) Patent No.: US 8,488,028 B2
(45) Date of Patent: Jul. 16, 2013

(54) SOLID STATE IMAGING DEVICE INCLUDING A PIXEL REGION, A BLACK REFERENCE REGION, AND A DUMMY REGION

(75) Inventor: Hidetoshi Koike, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 247 days.

(21) Appl. No.: 12/971,478

(22) Filed: Dec. 17, 2010

(65) Prior Publication Data

US 2011/0149137 A1 Jun. 23, 2011

(30) Foreign Application Priority Data

Dec. 18, 2009 (JP) ................. 2009-288313

(51) Int. Cl.
*H04N 9/64* (2006.01)
(52) U.S. Cl.
USPC ............................ 348/245; 348/294; 348/374
(58) Field of Classification Search
USPC ............... 348/222.1, 294, 241, 245, 308, 374
See application file for complete search history.

(56) References Cited

U.S. PATENT DOCUMENTS

| | | | |
|---|---|---|---|
| 2004/0174439 A1* | 9/2004 | Upton | 348/222.1 |
| 2006/0011813 A1* | 1/2006 | Park et al. | 250/208.1 |
| 2008/0283948 A1 | 11/2008 | Koike | |
| 2009/0108389 A1 | 4/2009 | Inoue | |
| 2010/0134667 A1* | 6/2010 | Suzuki et al. | 348/294 |
| 2010/0301444 A1 | 12/2010 | Koike | |
| 2011/0032391 A1* | 2/2011 | Cheung | 348/241 |

FOREIGN PATENT DOCUMENTS

| | | |
|---|---|---|
| CN | 1722459 A | 1/2006 |
| JP | 2003-282850 | 10/2003 |

OTHER PUBLICATIONS

U.S. Appl. No. 13/232,260, filed Sep. 14, 2011, Koike.
Combined Office Action and Search Report issued Dec. 4, 2012 in Chinese Application No. 201010591698.0 (With English Translation).

* cited by examiner

*Primary Examiner* — Gevell Selby
(74) *Attorney, Agent, or Firm* — Oblon, Spivak, McClelland, Maier & Neustadt, L.L.P.

(57) ABSTRACT

According to one embodiment, a solid state imaging device includes a pixel region to be used for generating pixels, a black reference region provided outside the pixel region, and a dummy region provided between the black reference region and the pixel region, and including a light shielding pattern configured to shield the black reference against light coming from the pixel region.

9 Claims, 12 Drawing Sheets

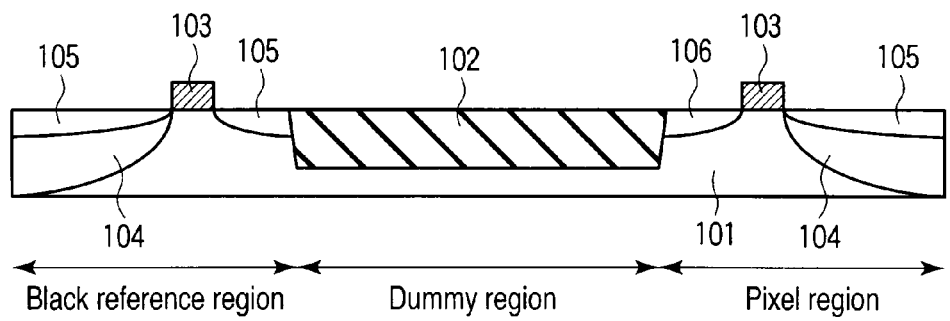
F I G. 13
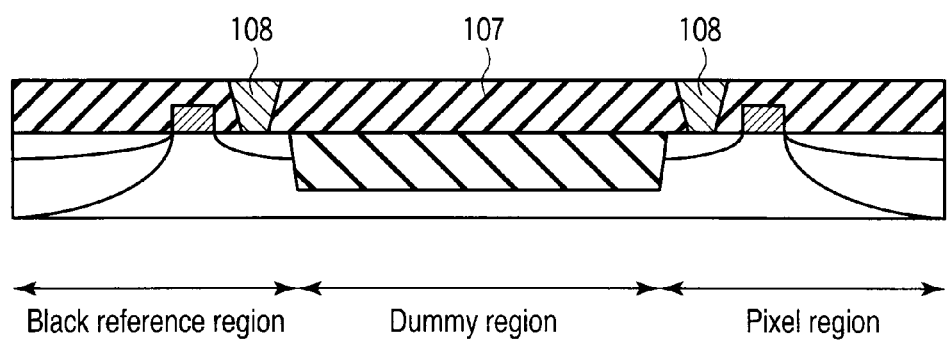
F I G. 14
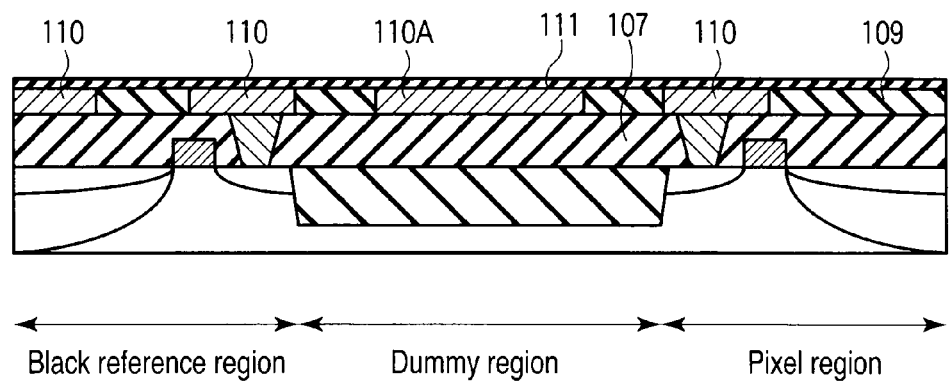
F I G. 15

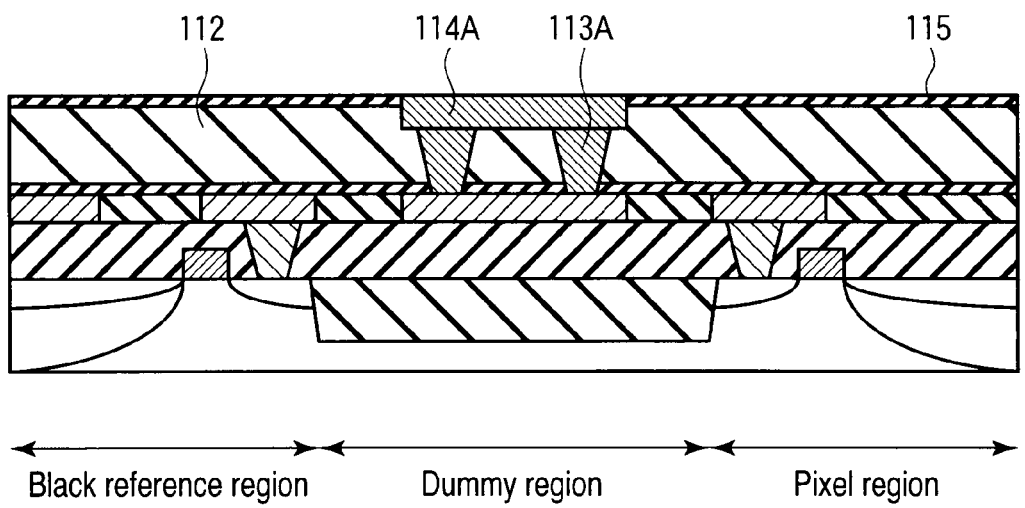
F I G. 16
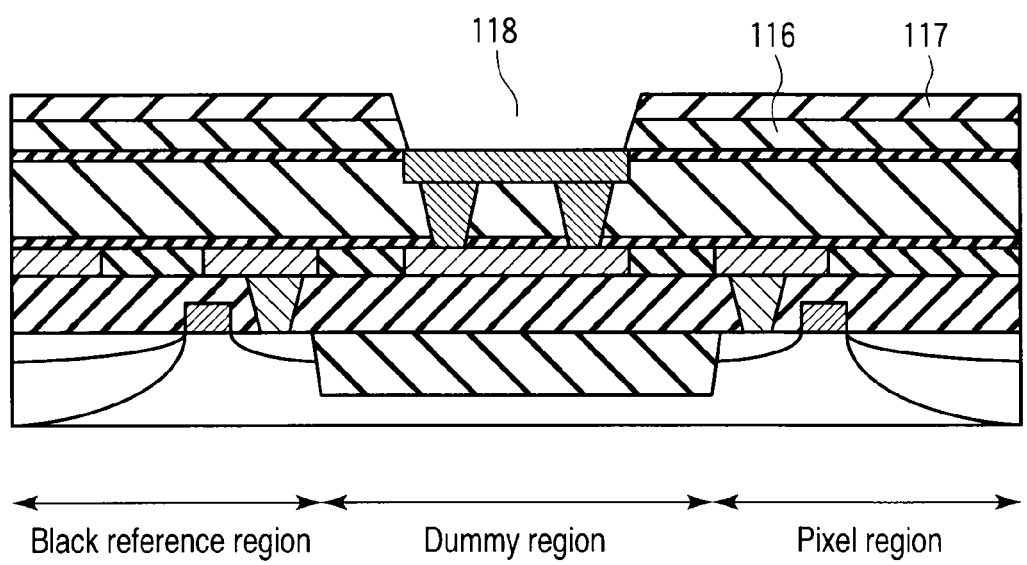
F I G. 17

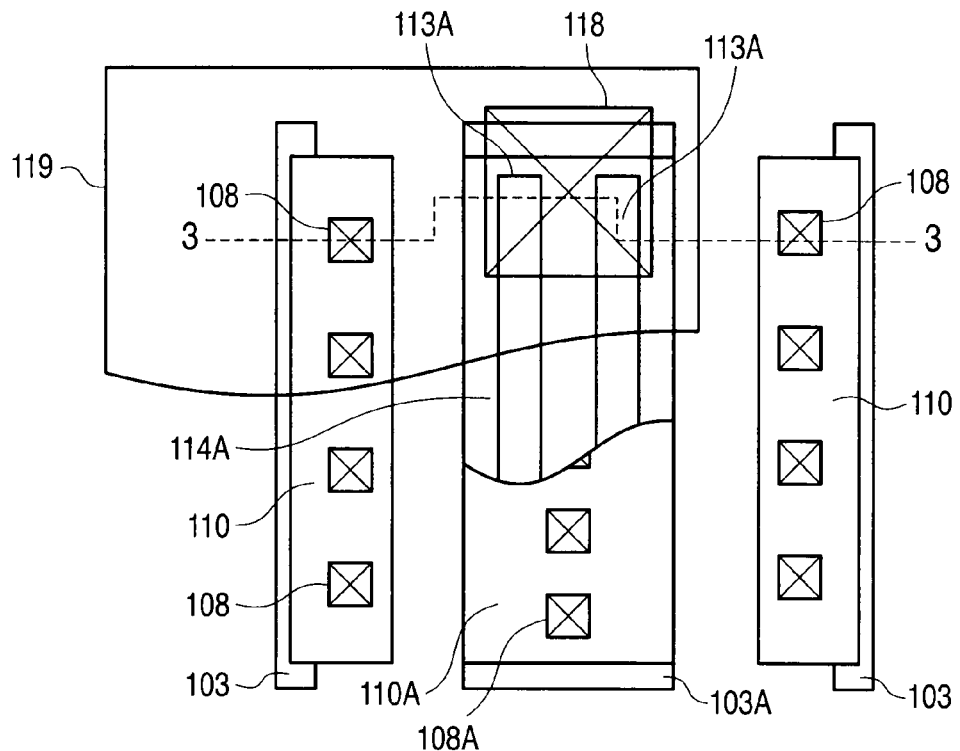
F I G. 20
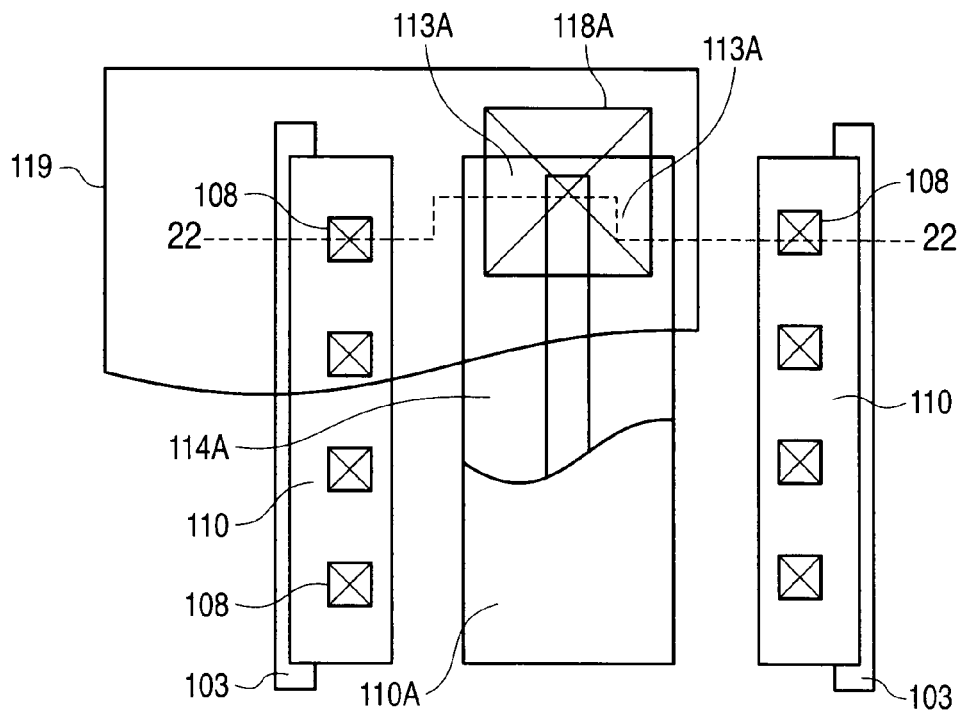
F I G. 21

SOLID STATE IMAGING DEVICE INCLUDING A PIXEL REGION, A BLACK REFERENCE REGION, AND A DUMMY REGION

CROSS-REFERENCE TO RELATED APPLICATIONS

This application is based upon and claims the benefit of priority from Japanese Patent Application No. 2009-288313, filed Dec. 18, 2009; the entire contents of which are incorporated herein by reference.

FIELD

Embodiments described herein relate generally to a solid state imaging device.

BACKGROUND

As one of semiconductor imaging devices, a CMOS (Complementary Metal Oxide Semiconductor) image sensor is known (patent reference 1). A pixel layout of the CMOS image sensor includes a pixel region, and a black reference region which is provided outside the pixel region and is used to specify a dark signal.

It is a common practice to provide a pixel dummy region between the pixel region and black reference region so as to prevent light leakage from the pixel region to the black reference region. Furthermore, a light shielding film such as an Al film is provided on the black reference region and pixel dummy region.

However, the conventional technique cannot sufficiently suppress light leakage to the black reference region, and it is hard to say that reduction of light leakage to the black reference region is attained.

BRIEF DESCRIPTION OF THE DRAWINGS

FIG. 13 is a sectional view showing a manufacturing method of a CMOS image sensor according to a second embodiment;
FIG. 14 is a sectional view showing the manufacturing method of the CMOS image sensor according to the second embodiment following FIG. 13;
FIG. 15 is a sectional view showing the manufacturing method of the CMOS image sensor according to the second embodiment following FIG. 14;
FIG. 16 is a sectional view showing the manufacturing method of the CMOS image sensor according to the second embodiment following FIG. 15;
FIG. 17 is a sectional view showing the manufacturing method of the CMOS image sensor according to the second embodiment following FIG. 16;
FIG. 20 is a plan view showing a CMOS image sensor according to a third embodiment;
FIG. 21 is a plan view showing a CMOS image sensor according to a fourth embodiment.

DETAILED DESCRIPTION

In general, according to one embodiment, a solid state imaging a pixel region to be used for generating pixels; a black reference region provided outside the pixel region; and a dummy region provided between the black reference region and the pixel region, and including a light shielding pattern configured to shield the black reference against light coming from the pixel region.

First Embodiment

Figure 1:
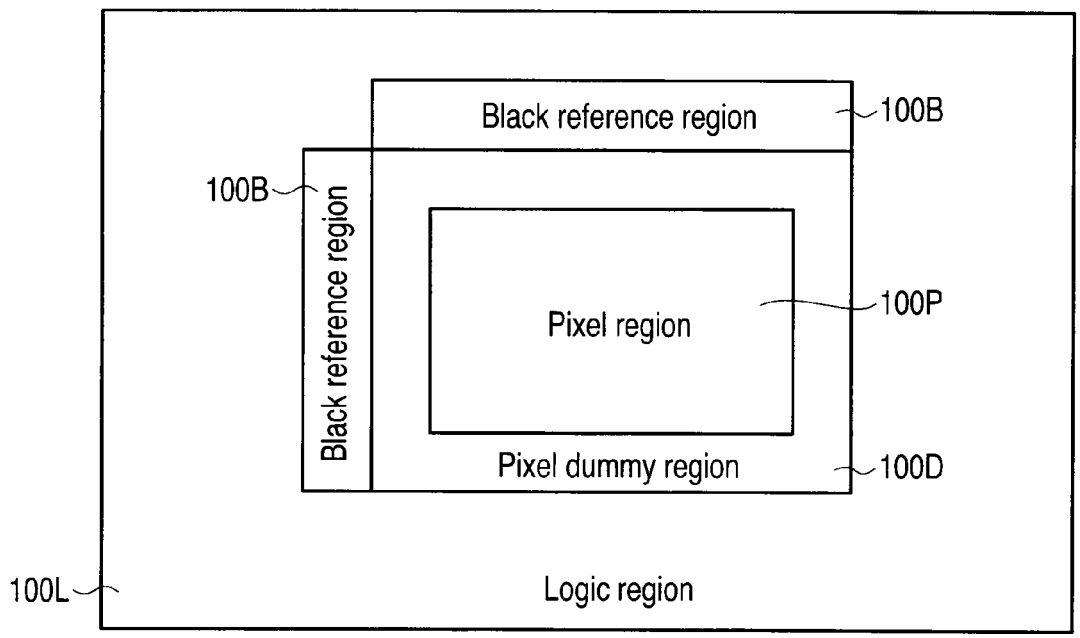
FIG. 1 is a plan view showing a layout of a CMOS image sensor.

FIG. 1 is a plan view showing a layout (pixel layout) of a CMOS image sensor.

As shown in FIG. 1, the pixel layout includes a pixel region 100P, black reference regions 100B which are provided outside the pixel region 100P and are used to specify a dark signal, and a pixel dummy region (to be simply referred to as a dummy region hereinafter) 100D which is provided between the pixel region 100P and black reference regions 100B and is used to prevent light leakage from the pixel region 100P to the black reference regions 100B. Outside these regions 100P, 100B, and 100D, a logic region 100L is provided. On the black reference regions 100B and dummy region 100D, a light shielding film such as an Al film (not shown) is provided.

Upon examining the reason why light leakage to the black reference regions cannot be sufficiently suppressed in such a conventional CMOS image sensor, it become apparent that incoming light along a lateral direction to the black reference regions (light leakage from the lateral direction) cannot be blocked.

A CMOS image sensor of an embodiment, which is achieved in consideration of the above cause, will be described below.

Figure 2:
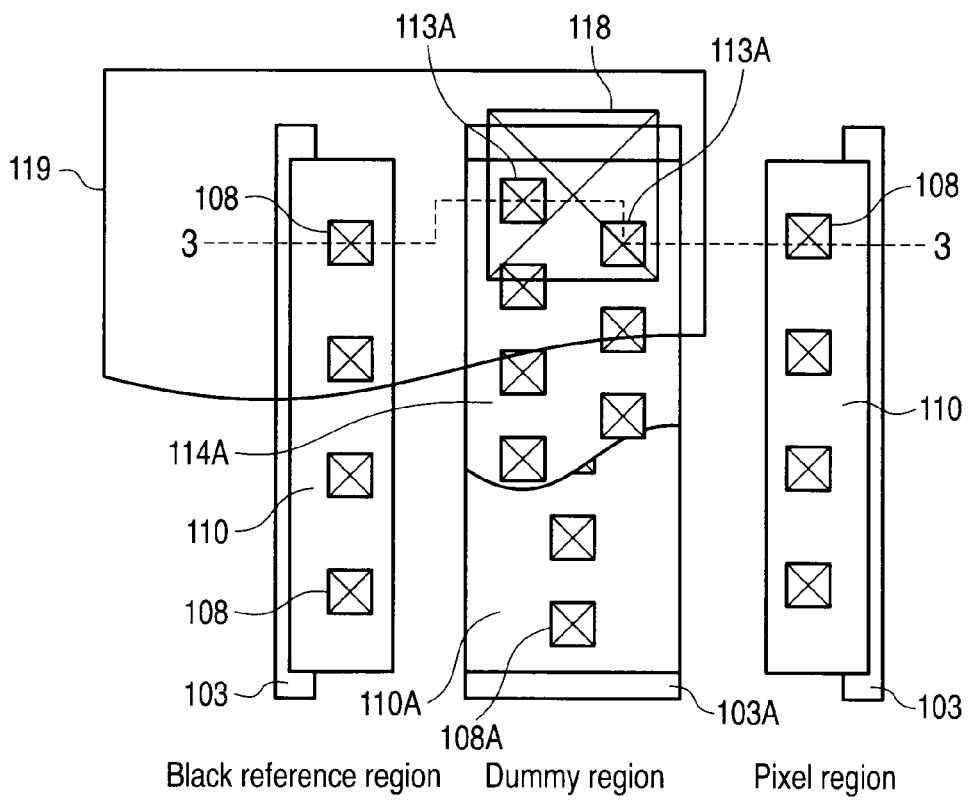
FIG. 2 is a plan view showing a CMOS image sensor according to a first embodiment.
Figure 3:
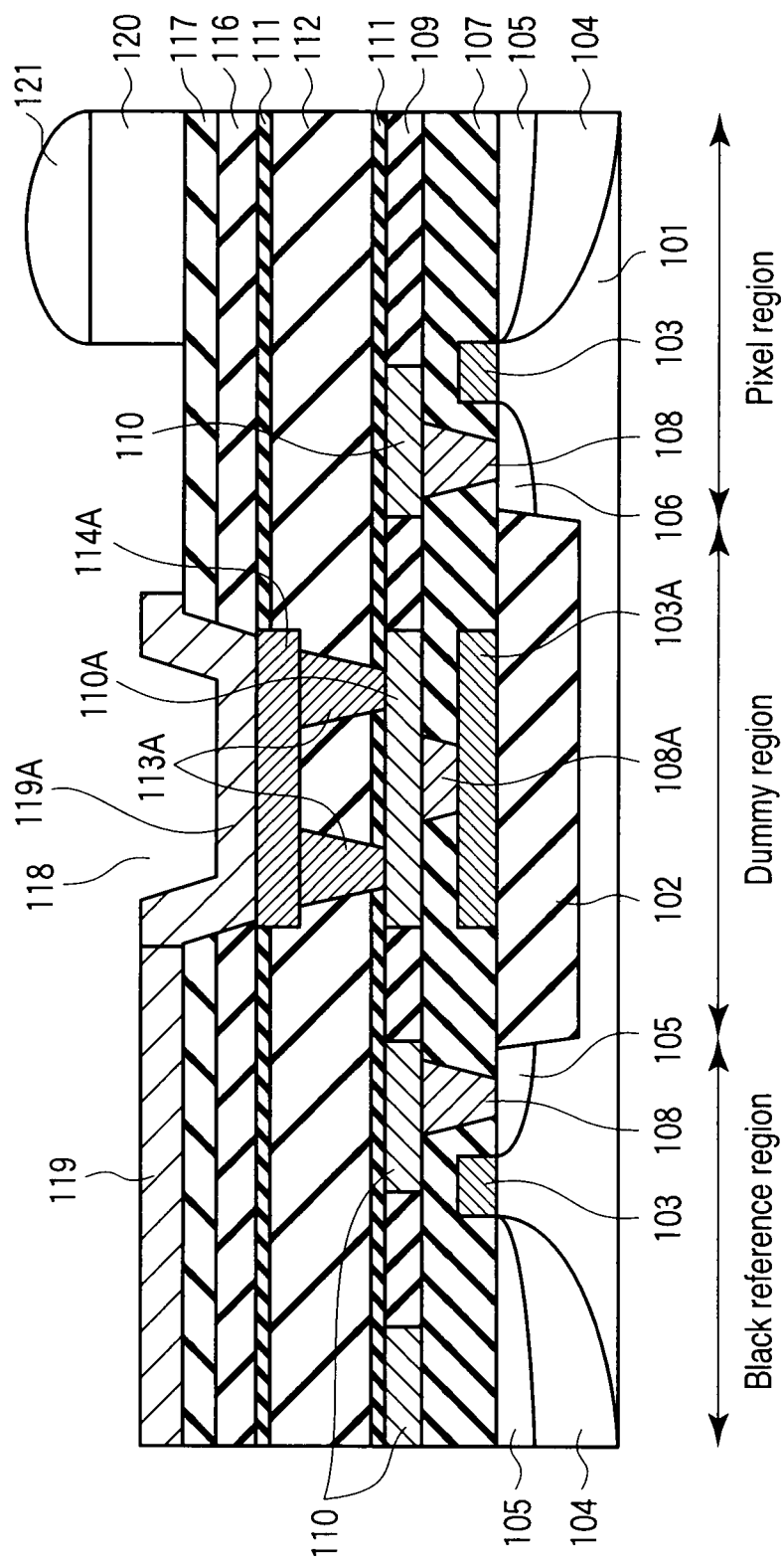
FIG. 3 is a sectional view taken along a line 3-3 in FIG. 2.

FIG. 2 is a plan view showing a CMOS image sensor of the present embodiment, and FIG. 3 is a sectional view taken along a line 3-3 in FIG. 2. Note that a color filter 120 and microlens 121 illustrated in FIG. 3 are not illustrated in FIG. 2.

The CMOS image sensor of the present embodiment includes a pixel region used to generate pixels, a black reference region which is provided outside the pixel region, and a dummy region which is provided between the black reference region and the pixel region, and includes a light shielding pattern to block the incoming light from the pixel region to the black reference region. The black reference region is a light-shielded region used to obtain a signal (black reference signal) as a reference signal of a signal level. Therefore, on the black reference region and dummy region, a light shielding film 119 as a light shielding pattern is provided as in the conventional art.

According to the present embodiment, the incoming light to the dummy region and black reference region from an upward direction is blocked by the light shielding film 119 as in the conventional art.

Figure 4:
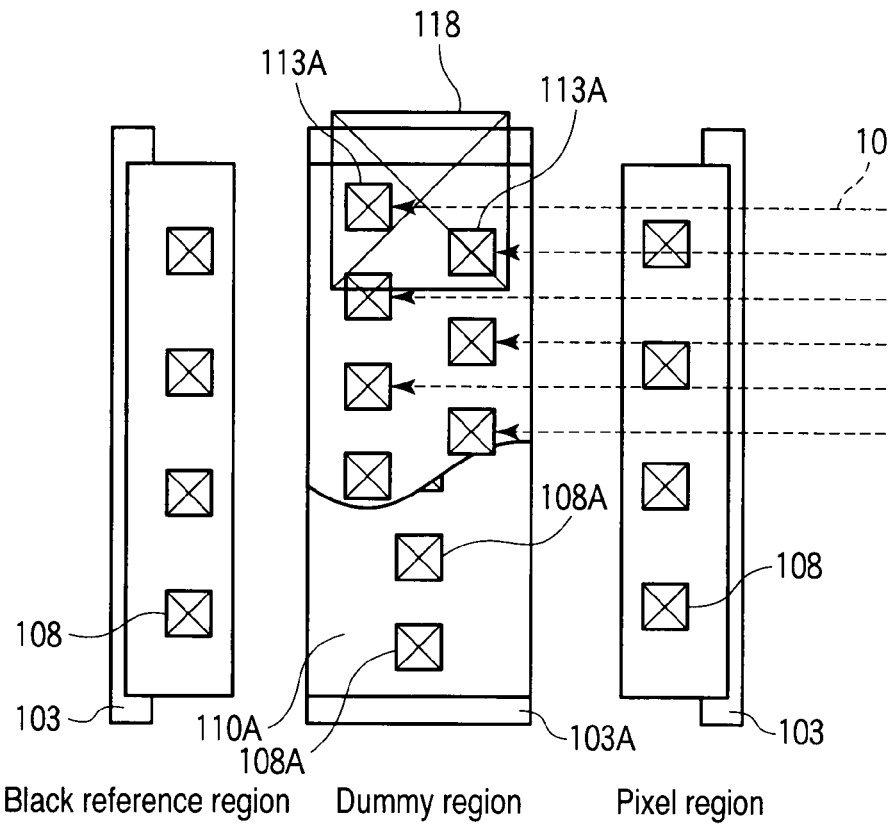
FIG. 4 is a plan view for explaining an effect of an embodiment.

Furthermore, according to the present embodiment, as shown in FIG. 4, the light 10 coming from the pixel region to the black reference along the lateral direction is sufficiently blocked by dummy Cu plugs 113A (first plug), a dummy gate 103A (first gate), W plugs 108A (second plug), a dummy Cu wiring 110A (a wiring formed of metal or metal silicide), a dummy Cu wiring 114A, and a light shielding film 119A on the dummy region.

Therefore, according to the present embodiment, light leakage to the black reference region can be reduced. Especially, in the present embodiment, since the dummy Cu plugs 113A are alternately arranged on the dummy region in a zigzag pattern without gap where the light 10 passes through, the light leakage along the lateral direction can be effectively suppressed.

Note that in FIG. 4, the incoming light 10 along the lateral direction propagates horizontally from the right to the left, but even in a case that the incoming light 10 propagates obliquely, the light leakage to the black reference region can be suppressed compared to the related art.

The dummy second W plugs 108A, which are not included in the conventional structure, are not alternately arranged on the dummy region so as not to form the gaps. However, as shown in FIG. 4, light leakage along the lateral direction can be blocked by a whole structure comprising the dummy W plugs 108A, W plugs 108 (third plug) on the pixel region, and W plugs 108 (fourth plug) on the black reference region. By devising the plug layout in this way, the light leakage to the black reference region can be reduced.

Then, since the light leakage to the black reference region can be reduced, output variations of a circuit connected to the black reference region (to be referred to as a black reference circuit) can be suppressed. Thereby, operation errors of the black reference circuit can be avoided. A practical example of output variations (FIG. 19) will be described after the second embodiment.

FIGS. 5, 6, 7, 8, 9, and 10 are sectional views showing a method of manufacturing a CMOS image sensor according to the first embodiment of the present.

[FIG. 5]

Figure 5:
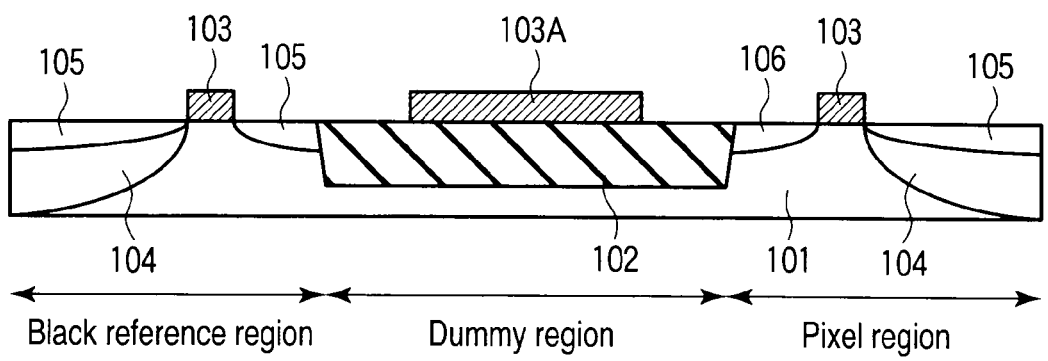
FIG. 5 is a sectional view showing a manufacturing method of a CMOS image sensor according to the first embodiment.

An isolation region 102 is formed on a silicon substrate 101 by STI (Shallow Trench Isolation) process, then, a gate (a gate insulating film, gate electrode) 103 (second gate) in the pixel region, a gate (a gate insulating film, gate electrode) 103 (third gate) in the black reference region, photodiode N regions 104, photodiode P regions 105, and source/drain diffusion layer 106 are formed by known method. Furthermore, a dummy gate (a dummy gate insulating film, dummy gate electrode) 103A is formed in the dummy region. Note that FIG. 5 illustrates the gate insulating film and the gate electrode on that film in combination as one gate 103. The same applies to the dummy gate 103A.

The gate 103 in the pixel region, the gate 103 in the black reference region, and the dummy gate 103A in the dummy region are formed at the same time by the same process. Therefore, the gate 103 in the pixel region and the gate 103 in the black reference region are formed of the same material as that of the dummy gate 103A.

[FIG. 6]

Figure 6:
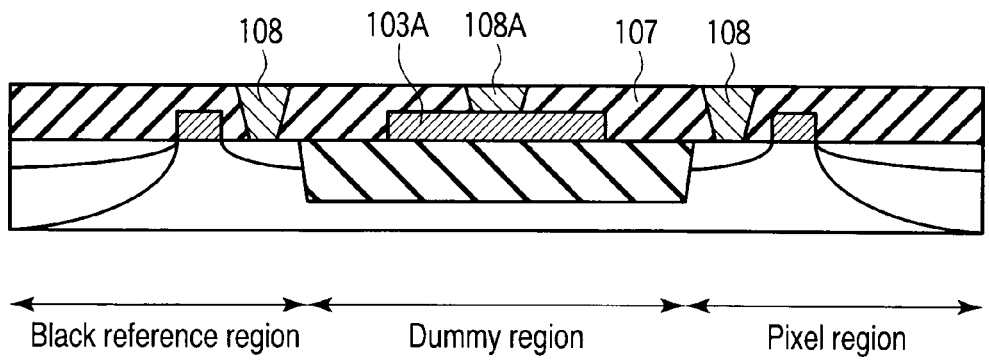
FIG. 6 is a sectional view showing the manufacturing method of the CMOS image sensor according to the first embodiment after FIG. 5.

A first insulating film to be processed into a first interlayer insulating film 107 is deposited, and is planarized by CMP method, thus the first interlayer insulating film 107 is formed. Note that reference numerals (for example, 101) which are not related to the description of FIG. 6 are not shown in FIG. 6 (the same applies to the following figures).

Next, first contact holes (not shown) are formed in the first interlayer insulating film 107 by using photolithography and etching. A first metal (here, tungsten (W); not shown) is deposited on the entire surface to fill the first contact holes.

After that, the first metal outside the first contact holes is removed and the surface is planarized by CMP method, thus the W plug 108 is formed in the pixel region, W plug 108 is formed in the black reference region, and dummy W plug 108A is formed in the dummy region.

The W plugs 108 are formed in the pixel region and black reference region, and the dummy W plug 108A is formed in the dummy region. The dummy W plug 108A is connected to the dummy gate 103A, and no gaps are formed between the dummy W plug 108A and dummy gate 103A.

[FIG. 7]

A second interlayer insulating film 109 is deposited, and first wiring trenches (not shown) are formed in the second interlayer insulating film 109 by using photolithography and etching. A second metal (here, copper (Cu); not shown) is deposited on the entire surface to fill the first wiring trenches.

Next, the second metal outside the first wiring trenches is removed and the surface is planarized by CMP method, thus Cu wirings 110 and a dummy Cu wiring 110A are formed. The Cu wirings 110 are formed in the pixel region and black reference region, and the dummy Cu wiring 110A is formed in the dummy region.

Figure 7:
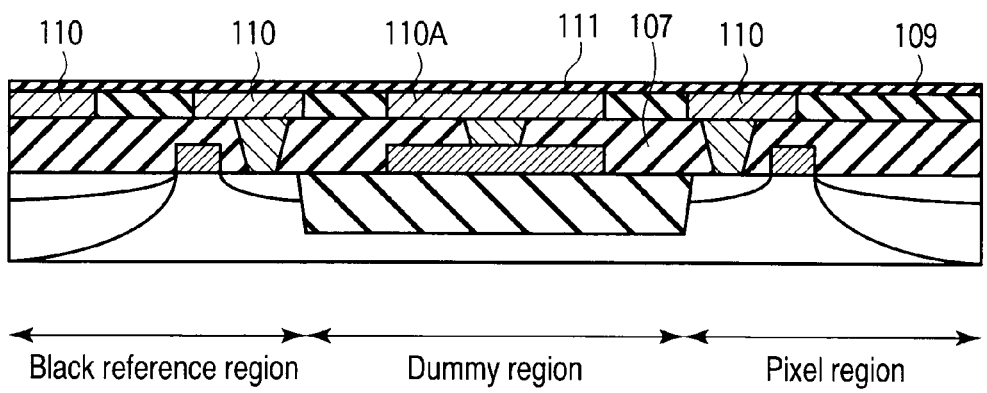
FIG. 7 is a sectional view showing the manufacturing method of the CMOS image sensor according to the first embodiment following FIG. 6.

Next, in order to prevent Cu as the material of these wirings 110 and 110A from being oxidized and diffused, a cap film (for example, silicon nitride film) 111 is deposited on the entire surface. The process in FIG. 7 is a well-known single damascene process of the Cu wiring.

[FIG. 8]

A third interlayer insulating film 112 is deposited, and second contact holes (not shown) are formed in the third interlayer insulating film 112 by using photolithography and etching. Subsequently, second wiring trench (not shown) is formed in the third interlayer insulating film 112 by using photolithography and etching.

Next, a third metal (here, Cu; not shown) is deposited on the entire surface to fill the second contact holes and second wiring trench. The third metal outside the second wiring trench is removed and the surface is planarized by CMP method, thus dummy Cu plugs 113A and a dummy Cu wiring 114A are selectively formed in the dummy region.

Figure 8:
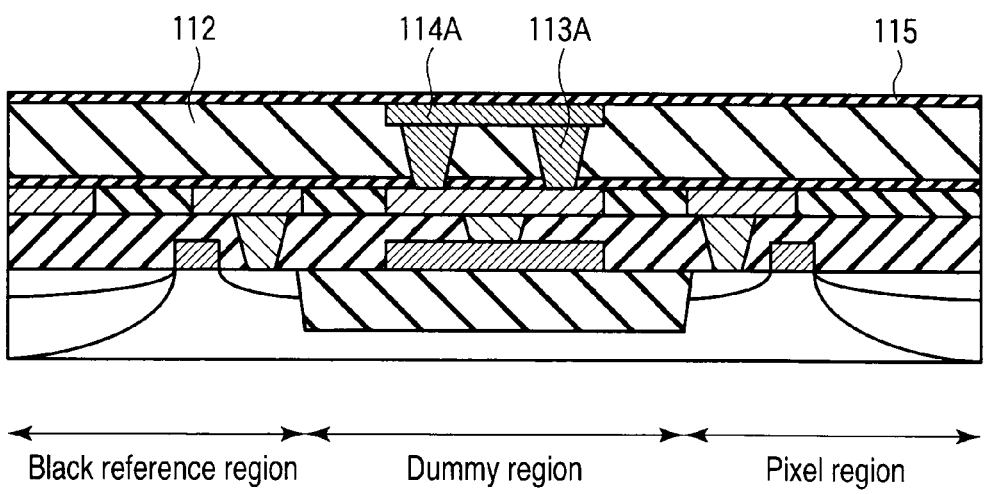
FIG. 8 is a sectional view showing the manufacturing method of the CMOS image sensor according to the first embodiment following FIG. 7.
Figure 9:
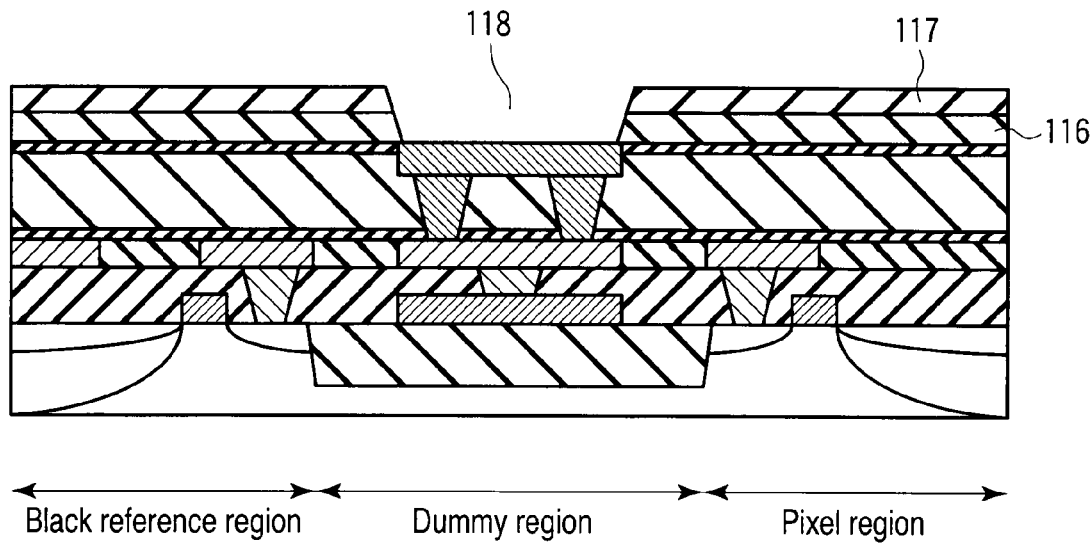
FIG. 9 is a sectional view showing the manufacturing method of the CMOS image sensor according to the first embodiment following FIG. 8.
Figure 10:
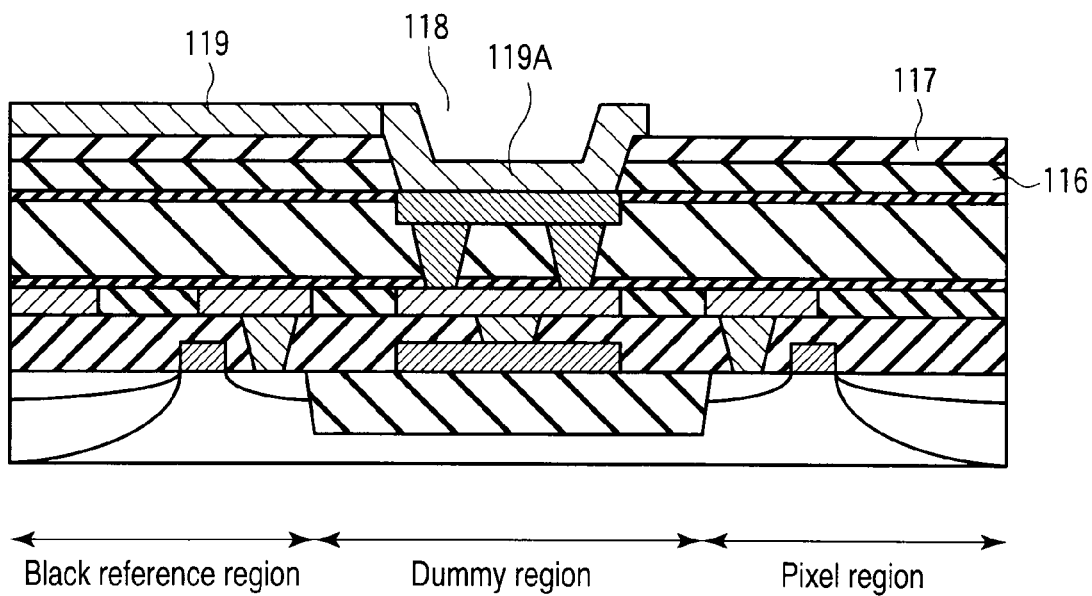
FIG. 10 is a sectional view showing the manufacturing method of the CMOS image sensor according to the first embodiment following FIG. 9.

Next, in order to prevent Cu as the material of these plugs 113A and wiring 114A from being oxidized and diffused, a cap film (for example, silicon nitride film) 115 is deposited on the entire surface. The process in FIG. 8 is a well-known dual damascene process of the Cu wiring.

In case of the present embodiment, the plugs 108A (W plugs) of the first layer are formed of material different from that of the plugs 113A (Cu plugs) of the second layer, but these plugs may be formed of the same material.

[FIG. 9]

A first passivation film (for example, silicon oxide film) 116 and second passivation film (for example, silicon nitride film) 117 are deposited successively on the entire surface, thereafter, a third contact hole 118 is formed by processing the passivation films 117 and 116 using are photolithography and etching. The third contact hole 118 is formed in the dummy region.

[FIG. 10]

An Al film to be processed into a light shielding film 119 is deposited on the entire surface, thereafter, the Al film is processed by using photolithography and etching to form the light shielding film 119 having a predetermined shape in the black reference region and dummy region. Note that reference numeral 119A denotes a light shielding film on the dummy region of the light shielding film 119. The light shielding film 119 has a pattern which can block the incoming light from the above with respect to the black reference region and dummy region.

After that, a CMOS image sensor shown in FIG. 3 is completed via known processes such as a process for forming color filters and microlenses in the pixel region.

Second Embodiment

Figure 11:
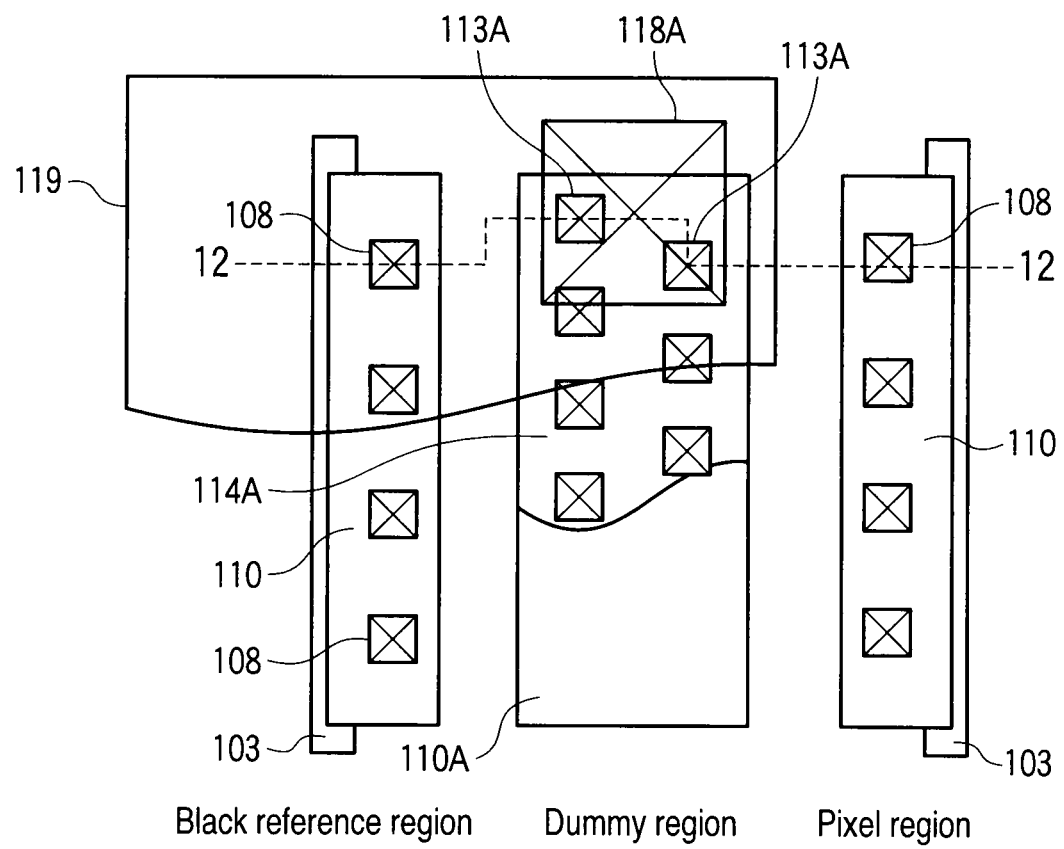
FIG. 11 is a plan view showing a CMOS image sensor according to the second embodiment.
Figure 12:
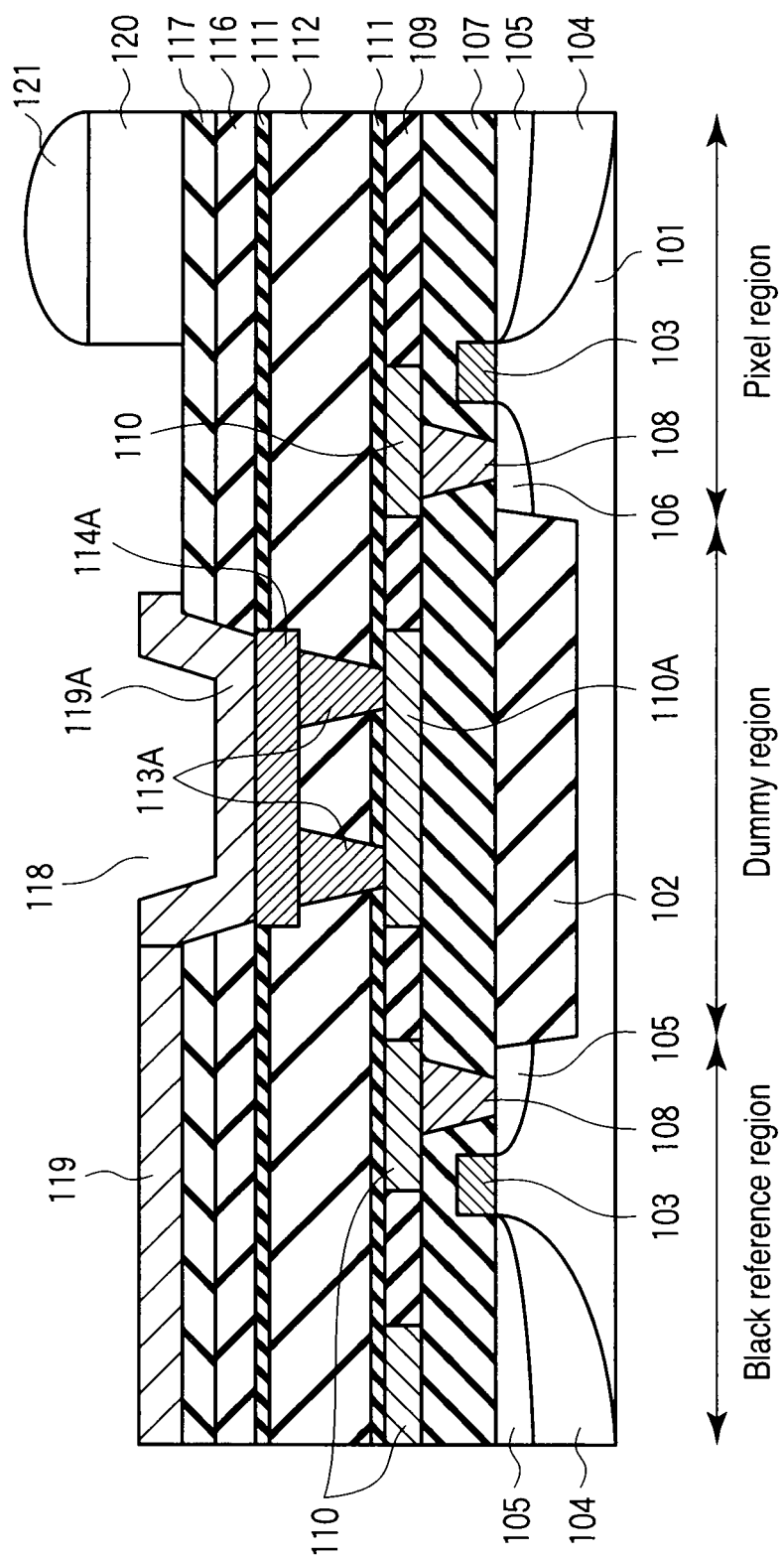
FIG. 12 is a sectional view taken along a line 12-12 in FIG. 11.
Figure 18:
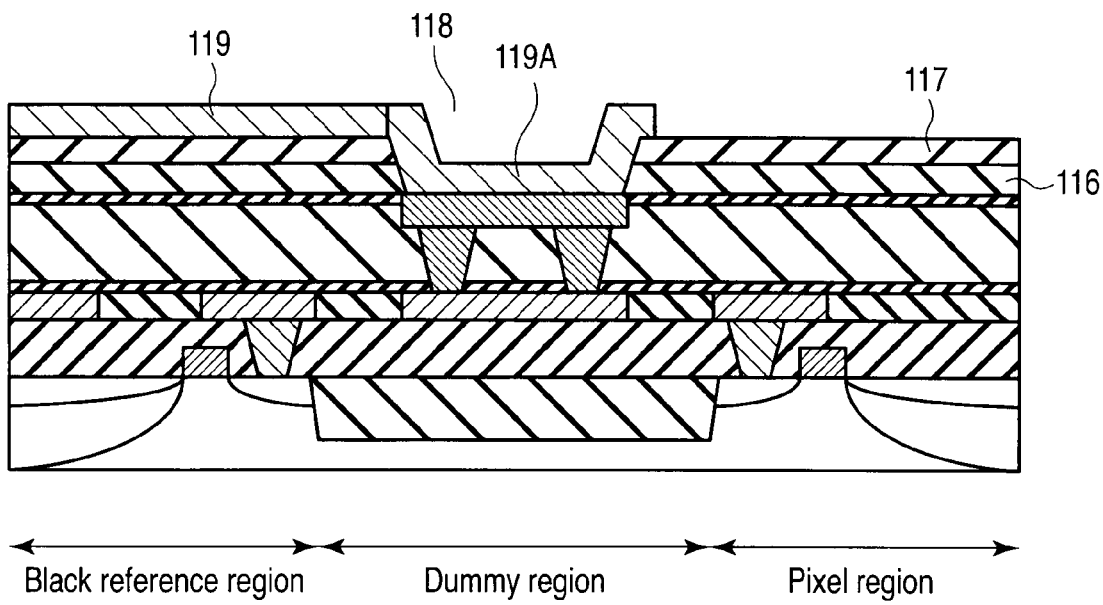
FIG. 18 is a sectional view showing the manufacturing method of the CMOS image sensor according to the second embodiment following FIG. 17.

FIG. 11 is a plan view showing a CMOS image sensor according to the second embodiment, and FIG. 12 is a sectional view taken along a line 12-12 in FIG. 11. Note that the same reference numerals denote parts corresponding to the figures already used in the above description, and a detailed description thereof will not be repeated.

A difference of the present embodiment from the first embodiment lies in that a dummy gate (gate 103A in FIG. 3) and dummy W plugs (plugs 108A in FIG. 3) on a dummy region are omitted.

In the present embodiment, incoming light 10 along the lateral direction is sufficiently blocked by dummy Cu plugs 113A, a dummy Cu wiring 110A, a dummy Cu wiring 114, and a light shielding film 119A on the dummy region, as in the first embodiment, and the effect of reducing the light leakage to a black reference region and that of avoiding operation errors of the black reference circuit can be obtained as in the first embodiment.

FIGS. 13-18 are sectional views showing a manufacturing method of a CMOS image sensor according to the second embodiment.

[FIG. 13]

An isolation region 102 is formed on a silicon substrate 101, then gates 103, photodiode N regions 104, photodiode P regions 105, and source/drain diffusion layer 106 are formed.

[FIG. 14]

A first interlayer insulating film 107 is formed, and W plugs 108 are formed in the first interlayer insulating film 107.

[FIG. 15]

A second interlayer insulating film 109 is formed, and Cu wirings 110 and a dummy Cu wiring 110A are formed in the second interlayer insulating film 109 by using single damascene process. In order to prevent Cu as the material of these wirings 110 and 110A from being oxidized and diffused, a cap film (for example, silicon nitride film) 111 is deposited on the entire surface.

[FIG. 16]

A third interlayer insulating film 112 is formed, and dummy Cu plugs 113A and a dummy Cu wiring 114A are formed in the third interlayer insulating film 112 of the dummy region by using dual damascene process. After that, in order to prevent Cu as the material of these plugs 113A and wiring 114A from being oxidized and diffused, a cap film (for example, silicon nitride film) 115 is deposited on the entire surface.

[FIG. 17]

A first passivation film (for example, silicon oxide film) 116 and second passivation film (for example, silicon nitride film) 117 are successively deposited on the entire surface, thereafter, a third contact hole 118 is formed, by processing the passivation films 117 and 116 using photolithography and etching.

[FIG. 18]

A light shielding film 119 having a pattern that can block the incoming light from the above with respect to the black reference region and dummy region is formed.

After that, a CMOS image sensor shown in FIG. 12 is completed via known processes such as a process for forming color filters and microlenses in the pixel region.

Figure 19:
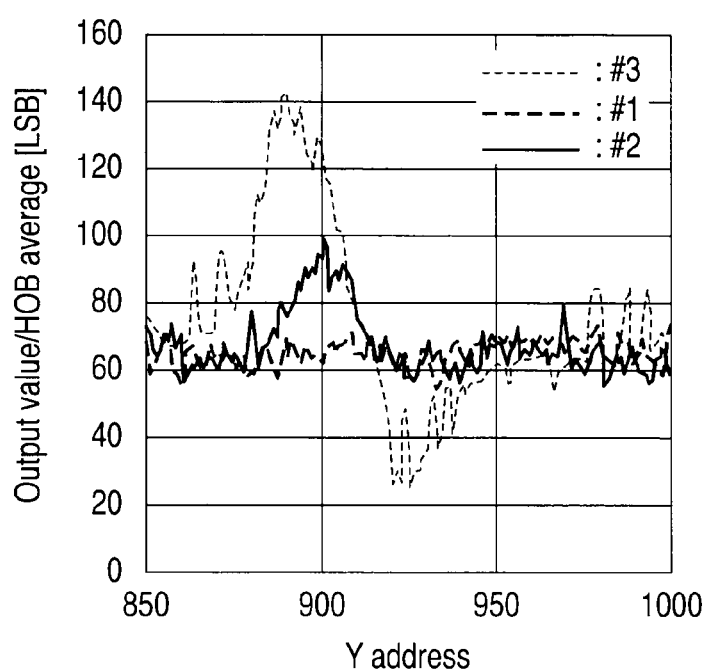
FIG. 19 is a graph showing Y address dependences of an output of a black reference circuit in the first and second embodiments and a comparative example.

FIG. 19 is a graph showing Y address (position in the lateral direction in FIG. 2) dependences of output of the black reference circuit in the first embodiment (#1), second embodiment (#2), and comparative example (#3). The comparative example (#3) corresponds to the conventional structure which does not include dummy plugs and dummy wiring in the dummy region. Furthermore, a black reference circuit which causes an operation error when an output value exceeds "64" is used. "HOB" on the ordinate is a short for "Horizontal Optical Black".

As can be seen from FIG. 19, in case of the first and second embodiments (#1, #2), output variations are sufficiently suppressed, and an output value does not exceed "64" at every Y addresses. On the other hand, as can be seen from FIG. 19, in case of the comparative example (#3), output variations are large, and there are Y addresses where output values exceed "64". The above results mean that operation errors of the black reference circuit cannot be avoided in the comparative example, but operation errors of the black reference circuit can be avoided in the present embodiment.

Third Embodiment

FIG. 20 is a plan view showing a CMOS image sensor according to the third embodiment. A sectional view taken along a line 3-3 of FIG. 20 is the same as FIG. 3 of the first embodiment.

A difference of the present embodiment from the first embodiment lies in the shape of dummy Cu plug 113A. A three-dimensional shape of the dummy Cu plug 113A of the first embodiment is a columnar shape, but that of the dummy Cu plug 113A of the present embodiment is a plate-like shape (wall-like shape). A planar shape of the dummy Cu plug 113A of the first embodiment is a square, but that of the dummy Cu plug 113A of the present embodiment is a rectangle.

In order to form the dummy Cu plugs 113A of the present embodiment, columnar second contact holes are formed in the third interlayer insulating film 112 in the process of FIG. 8 of the first embodiment. After that, deposition of Cu (third metal) and surface planarization are performed as in the first embodiment.

By using the plate-like dummy Cu plugs 113A of the present embodiment, the light coming from the pixel region to the black reference region along the lateral direction can be blocked more effectively.

Fourth Embodiment

Figure 22:
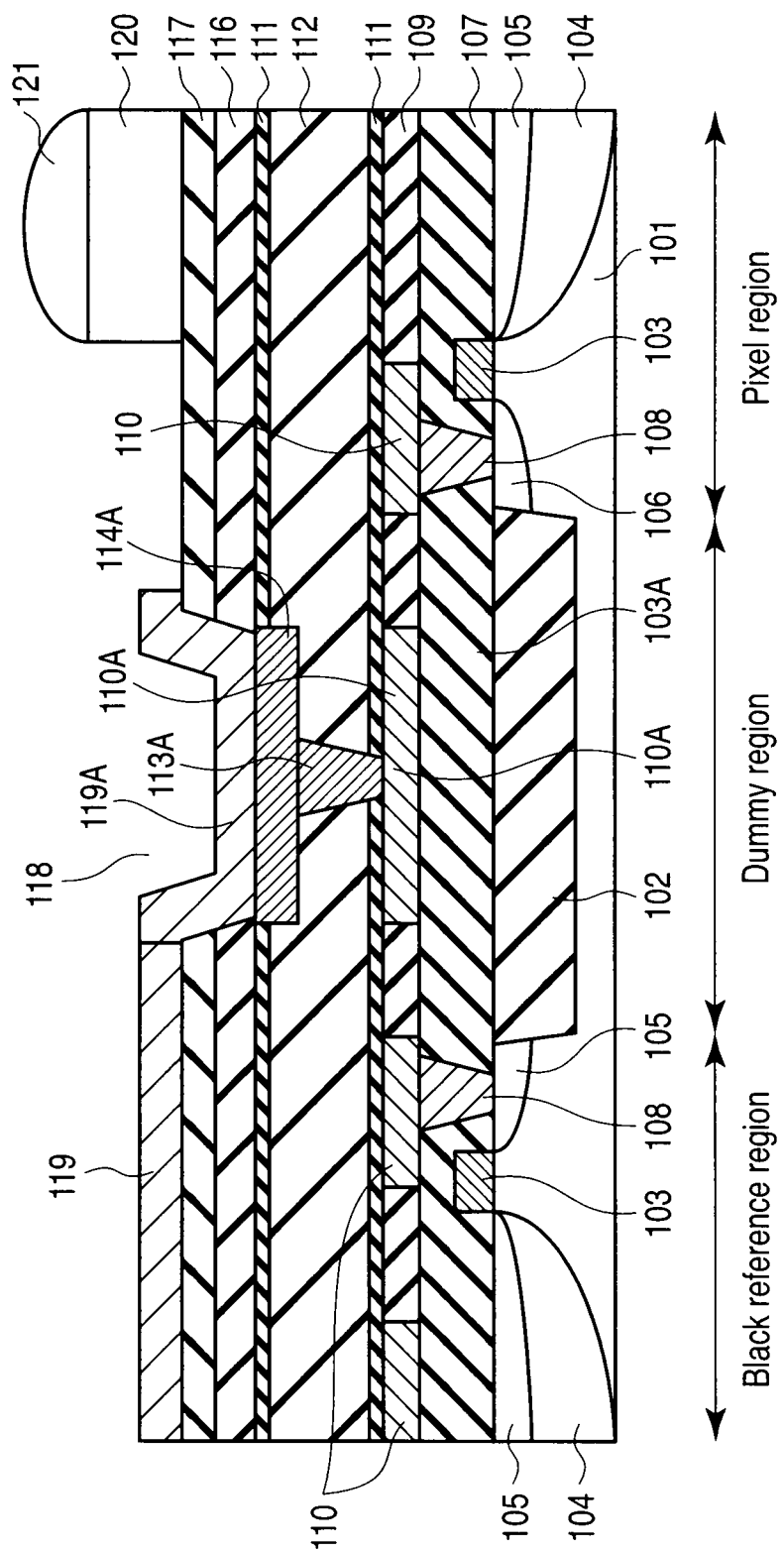
FIG. 22 is a sectional view taken along a line 22-22 in FIG. 21.

FIG. 21 is a plan view showing a CMOS image sensor according to the fourth embodiment, and FIG. 22 is a sectional view taken along a line 22-22 of FIG. 21.

A difference of the present embodiment from the third embodiment lies in that one columnar dummy Cu plug 113A is connected to a dummy Cu wiring 110A immediately above dummy first W plugs 108A. In the third embodiment, two columnar dummy Cu plugs 113A are connected to the dummy Cu wiring 110A on the two sides of the dummy first W plugs 108A.

In order to form the dummy Cu plug 113A of the present embodiment, one columnar second contact hole is formed in a third interlayer insulating film 112 immediately above the dummy first W plugs 108A in the process of FIG. 8 of the first embodiment. After that, deposition of Cu (third metal) and surface planarization (CMP) are performed as in the first embodiment.

According to the present embodiment, since the number of dummy Cu plugs 113A can be reduced compared to the third embodiment, a cost reduction can be achieved.

Note that the present invention is not limited to the above embodiments.

For example, the materials of the light shielding member patterns 103A, 108A, 110A, 113A, 114A, 118, and 119A formed in the dummy region are not limited to metals (for example, W, Cu, and Al), but materials which can block incoming light from the pixel region to the black reference region may be used. For example, metal silicide such as tungsten silicide may be used.

In addition, the CMOS image sensors have been exemplified. However, the present invention is also applicable to other solid state imaging devices such as a CCD (Charge Coupled Device) image sensor.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid state imaging device comprising:
a pixel region to be used for generating pixels;
a black reference region provided outside the pixel region; and
a dummy region provided between the black reference region and the pixel region, and including a light shielding pattern configured to shield the black reference against light coming from the pixel region,
wherein the light shielding pattern includes a plurality of first plugs formed of metal or metal silicide, and
wherein the plurality of first plugs are arranged in a zigzag layout without a gap where the light passes through.

2. The device according to claim 1, wherein the plurality of first plugs includes a plug having plate-like shape which is formed of metal or metal silicide, and arranged in a manner that the light is incapable of passing through the dummy region.

3. The device according to claim 2, further comprising a second gate provided in the pixel region and a third gate provided in the black reference region, and wherein the second gate and the third gate are formed of the same material as the first gates.

4. The device according to claim 1, further comprising a third plug provided in the pixel region and a fourth plug provided in the black reference region, and wherein the third plug and the fourth plug are formed of the same material as the second plugs, and the second plug is formed of material different from the first plug.

5. The device according to claim 1, further comprising a light shielding pattern provided on the black reference region and the dummy pattern.

6. A solid state imaging device comprising:
a pixel region to be used for generating pixels;
a black reference region provided outside the pixel region; and
a dummy region provided between the black reference region and the pixel region, and including a light shielding pattern configured to shield the black reference against light coming from the pixel region,
wherein the light shielding pattern includes a plurality of first plugs formed of metal or metal silicide, and
wherein the light shielding pattern includes a first gate which is formed of metal or metal silicide, and is arranged below the plurality of first plugs.

7. A solid state imaging device comprising:
a pixel region to be used for generating pixels;
a black reference region provided outside the pixel region; and
a dummy region provided between the black reference region and the pixel region, and including a light shielding pattern configured to shield the black reference against light coming from the pixel region, wherein the light shielding pattern further comprises:
a first gate which is formed of metal or metal silicide, and is arranged below the plurality of first plugs;
a wiring which is formed of metal or metal silicide, is arranged above the first gate, and is connected to the plurality of first plugs; and
a second plug provided between the wiring and the first gate, and connects the wiring and the first gates.

8. The device according to claim 7, wherein the plurality of first plugs include two plugs having plate-like shapes which are formed of metal or metal silicide and are arranged in a manner that the light is incapable of passing through the dummy region, and the two plug having the plate-like shapes are arranged at positions corresponding to two sides of the second plugs on the wiring.

9. The device according to claim 7, wherein the plurality of first plugs include a plug having plate-like shape which is formed of metal or metal silicide and is arranged in a manner that the light is incapable of passing through the dummy region, and the plug having the plate-like shape is arranged at a position corresponding to directly above the second plug above the wiring on the wiring.

* * * * *